United States Patent
Swaminathan et al.

(10) Patent No.: US 10,784,139 B2
(45) Date of Patent: Sep. 22, 2020

(54) ROTATABLE ELECTROSTATIC CHUCK HAVING BACKSIDE GAS SUPPLY

(71) Applicant: APPLIED MATERIALS, INC., Santa Clara, CA (US)

(72) Inventors: Bharath Swaminathan, San Jose, CA (US); Wei Wang, San Jose, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 161 days.

(21) Appl. No.: 15/839,563

(22) Filed: Dec. 12, 2017

(65) Prior Publication Data

US 2018/0174880 A1 Jun. 21, 2018

Related U.S. Application Data

(60) Provisional application No. 62/435,447, filed on Dec. 16, 2016.

(51) Int. Cl.
*H01L 21/683* (2006.01)
*H01L 21/687* (2006.01)
*H01L 21/67* (2006.01)

(52) U.S. Cl.
CPC .... *H01L 21/6833* (2013.01); *H01L 21/67017* (2013.01); *H01L 21/67098* (2013.01); *H01L 21/67109* (2013.01); *H01L 21/67115* (2013.01); *H01L 21/6831* (2013.01); *H01L 21/68742* (2013.01); *H01L 21/68792* (2013.01)

(58) Field of Classification Search
CPC ........... H01L 21/6833; H01L 21/68792; H01L 21/6831; H01L 21/68742; H01L 21/67115; H01L 21/67109; H01L 21/67017; H01L 21/67098

USPC ................................................. 361/233, 234
See application file for complete search history.

(56) References Cited

U.S. PATENT DOCUMENTS

| | | |
|---|---|---|
| 5,835,334 A | 11/1998 | McMillin et al. |
| 6,611,417 B2 | 8/2003 | Chen |
| 2002/0189940 A1 | 12/2002 | Tsai et al. |

(Continued)

FOREIGN PATENT DOCUMENTS

KR 10-2004-0070008 A 8/2004

OTHER PUBLICATIONS

International Search Report and Written Opinion dated Mar. 30, 2018 for PCT Application No. PCT/US 2017/066332.
European Search Report for EP 17880590 dated Jun. 12, 2020.

*Primary Examiner* — Dharti H Patel
(74) *Attorney, Agent, or Firm* — Moser Taboada; Alan Taboada

(57) ABSTRACT

Embodiments of a substrate support pedestal and an electrostatic chuck incorporating same are disclosed herein. In some embodiments, a substrate support pedestal includes: a body having an upper surface and a lower surface opposite the upper surface; one or more chucking electrodes disposed within the body; a plurality of substrate support elements protruding from the upper surface to support a substrate; a hole disposed in the lower surface at a center of and partially through the body; a plurality of gas holes disposed in the upper surface proximate the center of the body, wherein the plurality of gas holes is disposed above and fluidly coupled to the hole; and a plurality of gas distribution grooves formed in the upper surface and fluidly coupled to the plurality of gas holes.

20 Claims, 6 Drawing Sheets

(56) References Cited

U.S. PATENT DOCUMENTS

| | | |
|---|---|---|
| 2009/0014323 A1 | 1/2009 | Yendler et al. |
| 2009/0034149 A1 | 2/2009 | Lubomirsky et al. |
| 2009/0273878 A1 | 11/2009 | Lee et al. |
| 2010/0039747 A1* | 2/2010 | Sansoni ............ H01L 21/6833 |
| | | 361/234 |
| 2010/0193130 A1 | 8/2010 | Kawakami et al. |
| 2015/0170952 A1* | 6/2015 | Subramani ............ H02N 13/00 |
| | | 361/234 |
| 2015/0279714 A1 | 10/2015 | Yamaguchi et al. |
| 2017/0125274 A1 | 5/2017 | Swaminathan et al. |

\* cited by examiner

US 10,784,139 B2

ROTATABLE ELECTROSTATIC CHUCK HAVING BACKSIDE GAS SUPPLY

CROSS-REFERENCE TO RELATED APPLICATIONS

This application claims the benefit of U.S. Provisional Patent Application No. 62/435,447, filed with the United States Patent Office on Dec. 16, 2016, which is herein incorporated by reference in its entirety.

FIELD

Embodiments of the present disclosure generally relate to electrostatic chucks used to retain substrates in microelectronic device fabrication processes.

BACKGROUND

Formation of some devices on substrates (e.g., STT-RAM) requires multiple layers of thin films which are deposited in a deposition chamber, such as a physical vapor deposition (PVD) chamber. In some embodiments, the substrate needs to be rotated during the deposition process to obtain good film uniformity. For example, when the deposition process requires multiple cathodes and targets to deposit the different materials, the substrate needs to be rotated to ensure good film uniformity because each target is typically disposed off-axis with respect to the substrate. Deposition of some layers may also require the substrate to be heated. Further, the deposition process requires a high vacuum pressure. An electrostatic chuck is often used to electrostatically retain a substrate on a substrate support during the deposition process. Conventionally, an electrostatic chuck comprises a ceramic body having one or more electrodes disposed therein. Typical electrostatic chucks only move vertically up and down to facilitate substrate transfers. However, the inventors have observed that such a movement limitation prevents using these conventional electrostatic chucks for off-axis deposition due to non-uniform deposition on the substrate.

Furthermore, when switching between low and high temperature processes, conventional electrostatic chucks requires the changing of many parts of the electrostatic chuck because the pedestal is bonded to the remainder of the electrostatic chuck. As such, throughput is negatively affected because vacuum seals are broken when switching between high temperature and low temperature electrostatic chucks.

Therefore, the inventors have provided embodiments of an improved rotatable heated electrostatic chuck.

SUMMARY

Embodiments of a substrate support pedestal and an electrostatic chuck incorporating same are disclosed herein. In some embodiments, a substrate support pedestal includes: a body having an upper surface and a lower surface opposite the upper surface; one or more chucking electrodes disposed within the body; a plurality of substrate support elements protruding from the upper surface to support a substrate; a hole disposed in the lower surface at a center of and partially through the body; a plurality of gas holes disposed in the upper surface proximate the center of the body, wherein the plurality of gas holes is disposed above and fluidly coupled to the hole; and a plurality of gas distribution grooves formed in the upper surface and fluidly coupled to the plurality of gas holes.

In some embodiments, a processing chamber, includes a chamber body defining an interior volume; and a substrate support disposed within the interior volume. The substrate support includes a substrate support pedestal having a body having an upper surface and a lower surface opposite the upper surface; one or more chucking electrodes disposed within the body; a plurality of substrate support elements protruding from the upper surface to support a substrate; a hole disposed in the lower surface at a center of and partially through the body; a plurality of gas holes disposed in the upper surface proximate the center of the body, wherein the plurality of gas holes is disposed above and fluidly coupled to the hole; and a plurality of gas distribution grooves formed in the upper surface and fluidly coupled to the plurality of gas holes.

In some embodiments, a substrate support pedestal includes: a body having an upper surface and a lower surface opposite the upper surface; one or more chucking electrodes disposed within the body; a plurality of substrate support elements protruding from the upper surface to support a substrate; a hole disposed in the lower surface at a center of and partially through the body; a plurality of gas holes disposed in the upper surface proximate the center of the body, wherein the plurality of gas holes is disposed above and fluidly coupled to the hole; a plurality of gas distribution grooves formed in the upper surface and fluidly coupled to the plurality of gas holes; and a gas plug disposed in the hole beneath the plurality of gas holes, wherein the gas plug includes a channel extending along a central axis of the gas plug and having a first diameter, wherein the channel terminates at an expansion opening formed in a top surface of the gas plug, and wherein the expansion opening has a second diameter larger than the first diameter to allow gas passing through the channel to expand into the expansion opening before flowing through the plurality of gas holes.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
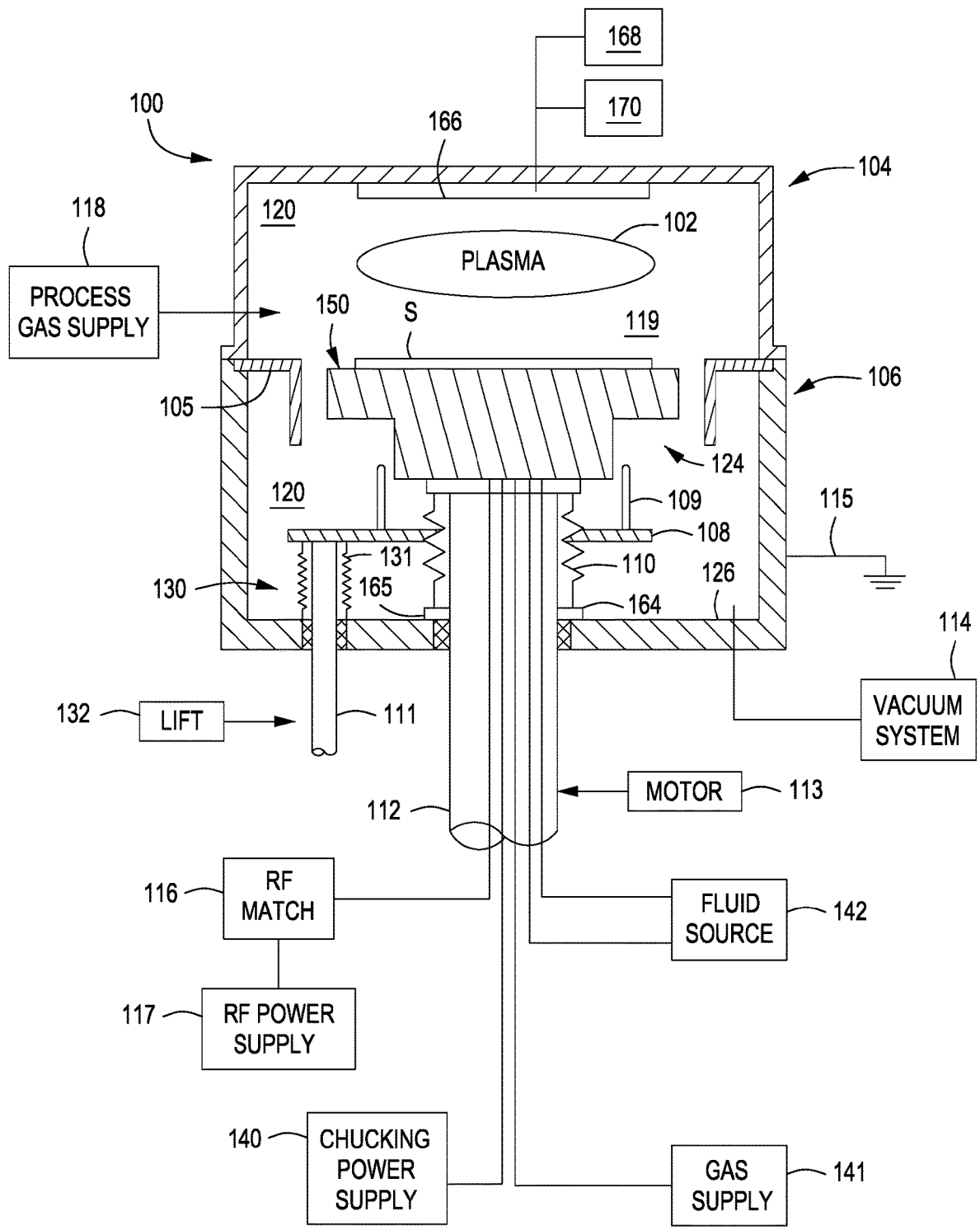
FIG. 1 depicts a schematic view of a process chamber suitable for use with an electrostatic chuck in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of substrate support pedestals and rotatable, heated electrostatic chucks incorporating same are provided herein. The inventive substrate support pedestals advantageously improve backside gas distribution uniformity. The inventive substrate support pedestals also increase throughput when switching between high and low temperature processes by providing a removeable pedestal that can be quickly swapped with another pedestal suitable for a process that is run at a different temperature. The inventive electrostatic chucks advantageously allow for the coupling of DC power from a DC power source to one or more chucking electrodes disposed in a rotating pedestal.

FIG. 1 is a schematic cross-sectional view of plasma processing chamber in accordance with some embodiments of the present disclosure. In some embodiments, the plasma processing chamber is a physical vapor deposition (PVD) processing chamber. However, other types of processing chambers can also use or be modified for use with embodiments of the inventive electrostatic chuck described herein.

The chamber 100 is a vacuum chamber which is suitably adapted to maintain sub-atmospheric pressures within a chamber interior volume 120 during substrate processing. The chamber 100 includes a chamber body 106 covered by a lid 104 which encloses a processing volume 119 located in the upper half of chamber interior volume 120. The chamber 100 may also include one or more shields 105 circumscribing various chamber components to prevent unwanted reaction between such components and ionized process material. The chamber body 106 and lid 104 may be made of metal, such as aluminum. The chamber body 106 may be grounded via a coupling to ground 115.

A substrate support 124 is disposed within the chamber interior volume 120 to support and retain a substrate S, such as a semiconductor wafer, for example, or other such substrate as may be electrostatically retained. The substrate support 124 may generally comprise an electrostatic chuck 150 (described in more detail below with respect to FIGS. 2-4) and a hollow support shaft 112 for supporting the electrostatic chuck 150. The hollow support shaft 112 provides a conduit to provide, for example, process gases, fluids, coolants, power, or the like, to the electrostatic chuck 150.

In some embodiments, the hollow support shaft 112 is coupled to a motor 113 which acts as a rotation assembly to rotate the hollow support shaft 112 and, optionally, a vertical lift to provide vertical movement of the electrostatic chuck 150 between an upper, processing position (as shown in FIG. 1) and a lower, transfer position (not shown). A bellows assembly 110 is disposed about the hollow support shaft 112 and is coupled between the electrostatic chuck 150 and a bottom surface 126 of chamber 100 to provide a flexible seal that allows vertical motion of the electrostatic chuck 150 while preventing loss of vacuum from within the chamber 100. The bellows assembly 110 also includes a lower bellows flange 164 in contact with an o-ring 165 or other suitable sealing element which contacts bottom surface 126 to help prevent loss of chamber vacuum.

The hollow support shaft 112 provides a conduit for coupling a fluid source 142, a gas supply 141, a chucking power supply 140, and RF sources (e.g., RF plasma power supply 170 and RF bias power supply 117) to the electrostatic chuck 150. In some embodiments, RF plasma power supply 170 and RF bias power supply 117 are coupled to the electrostatic chuck via respective RF match networks (only RF match network 116 shown).

A substrate lift 130 may include lift pins 109 mounted on a platform 108 connected to a shaft 111 which is coupled to a second lift mechanism 132 for raising and lowering the substrate lift 130 so that the substrate "S" may be placed on or removed from the electrostatic chuck 150. The electrostatic chuck 150 includes thru-holes (described below) to receive the lift pins 109. A bellows assembly 131 is coupled between the substrate lift 130 and bottom surface 126 to provide a flexible seal which maintains the chamber vacuum during vertical motion of the substrate lift 130.

The chamber 100 is coupled to and in fluid communication with a vacuum system 114 which includes a throttle valve (not shown) and vacuum pump (not shown) which are used to exhaust the chamber 100. The pressure inside the chamber 100 may be regulated by adjusting the throttle valve and/or vacuum pump. The chamber 100 is also coupled to and in fluid communication with a process gas supply 118 which may supply one or more process gases to the chamber 100 for processing a substrate disposed therein.

In operation, for example, a plasma 102 may be created in the chamber interior volume 120 to perform one or more processes. The plasma 102 may be created by coupling power from a plasma power source (e.g., RF plasma power supply 170) to a process gas via one or more electrodes proximate to or within the chamber interior volume 120 to ignite the process gas and creating the plasma 102. In some embodiments, a bias power may also be provided from a bias power supply (e.g., RF bias power supply 117) to one or more electrodes (described below) disposed within the electrostatic chuck 150 via a capacitively coupled bias plate (described below) to attract ions from the plasma towards the substrate S.

In some embodiments, for example where the chamber 100 is a PVD chamber, a target 166 comprising a source material to be deposited on a substrate S may be disposed above the substrate and within the chamber interior volume 120. The target 166 may be supported by a grounded conductive portion of the chamber 100, for example an aluminum adapter through a dielectric isolator. In other embodiments, the chamber 100 may include a plurality of targets in a multi-cathode arrangement for depositing layers of different material using the same chamber.

A controllable DC power source 168 may be coupled to the chamber 100 to apply a negative voltage, or bias, to the target 166. The RF bias power supply 117 may be coupled to the substrate support 124 in order to induce a negative DC bias on the substrate S. In addition, in some embodiments, a negative DC self-bias may form on the substrate S during processing. In some embodiments, an RF plasma power supply 170 may also be coupled to the chamber 100 to apply RF power to the target 166 to facilitate control of the radial distribution of a deposition rate on substrate S. In operation, ions in the plasma 102 created in the chamber 100 react with the source material from the target 166. The reaction causes the target 166 to eject atoms of the source material, which are then directed towards the substrate S, thus depositing material.

Figure 2:
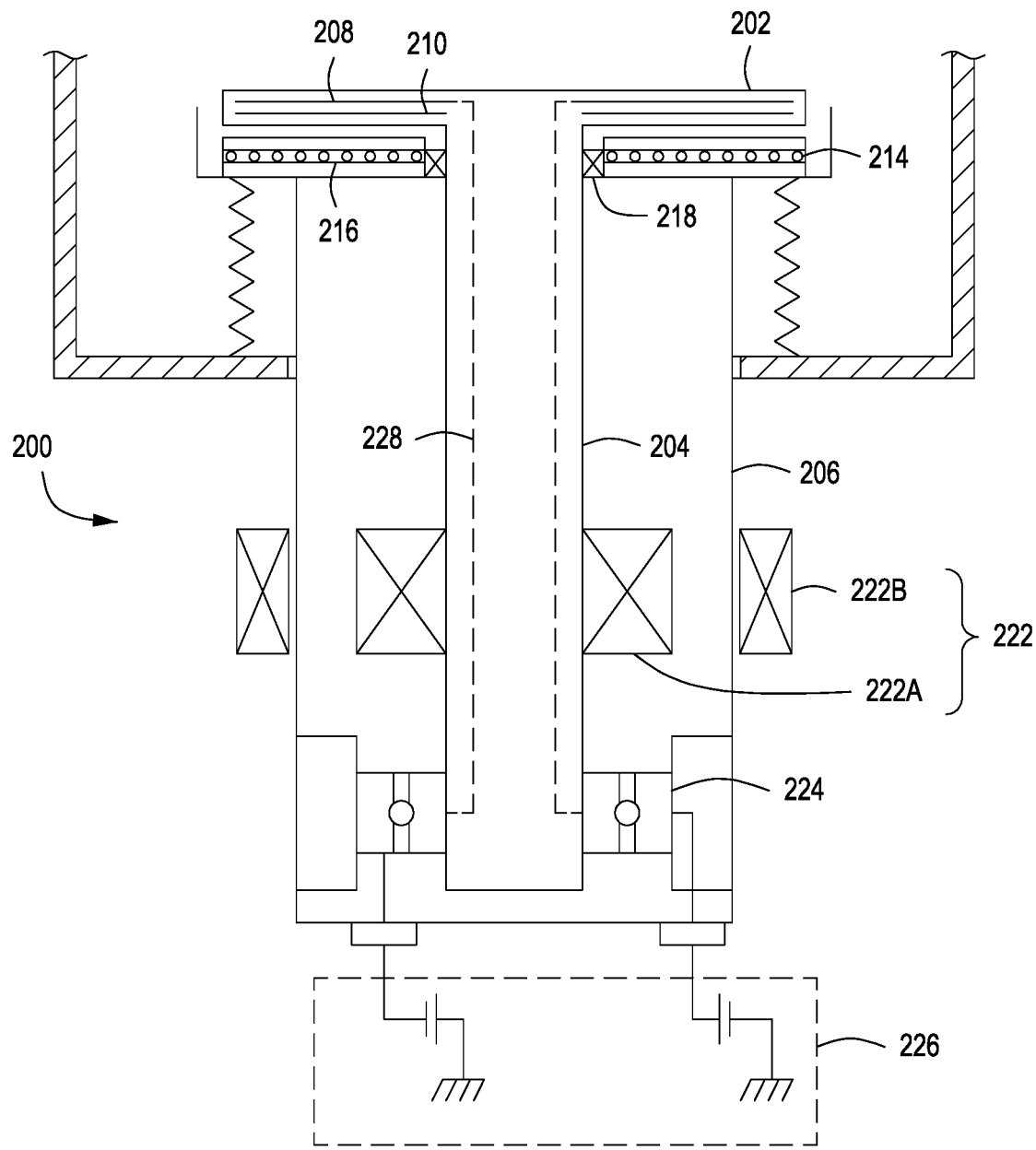
FIG. 2 depicts a schematic cross-sectional view of an electrostatic chuck in accordance with some embodiments of the present disclosure.

FIG. 2 depicts a schematic cross-sectional view of an electrostatic chuck (chuck 200) in accordance with embodiments of the present disclosure. The chuck 200 includes a substrate support pedestal (e.g., disc 202), a shaft 204 extending from the bottom of the disc 202, and a housing 206 enclosing the disc 202, the shaft 204, and all the components (described below) of the chuck 200.

The disc 202 is formed of a dielectric material, such as a ceramic material, for example, aluminum nitride, aluminum oxide, boron nitride, alumina doped with titanium oxide, and the like. In some embodiments, the disc 202 is formed of aluminum nitride which is doped to control the bulk electrical resistivity of the disc 202. The disc 202 includes one or more chucking electrodes 208 disposed near an upper surface of the disc 202. The one or more chucking electrodes 208 are fabricated from a suitable conductive material, such as molybdenum, titanium, or the like. The one or more chucking electrodes 208 may be arranged in any configuration that will sufficiently secure the substrate to the upper surface of the disc during processing. For example, the one or more chucking electrodes 208 may be arranged to provide a single electrode electrostatic chuck, a bipolar electrostatic chuck, or the like.

As noted above, the disc 202 may also include one or more RF bias electrodes 210. The one or more RF bias electrodes 210 are configured to attract ions from the plasma towards the substrate disposed on the disc 202. Power is delivered to the RF bias electrodes 210 via RF bias power supply 117. In some embodiments, an RF bias plate (not shown) may be used to capacitively couple RF bias power to the RF bias electrodes 210, thus removing any direct electrical coupling. Accordingly, power can be delivered to the RF bias electrodes 210 while the disc 202 is being rotated.

To facilitate heating of the disc 202 and a substrate when disposed thereon, the chuck 200 includes a lamp housing 216, which includes a plurality of lamps 214. The lamp housing 216 is formed of a material capable of withstanding the heat of the plurality of lamps 214. For example, the lamp housing 216 may be formed of a ceramic material. The plurality of lamps 214 includes any type of lamp capable of emitting enough heat to heat the disc 202 via radiation. For example, the plurality of lamps 214 may include halogen lamps. In some embodiments, the total power output of the plurality of lamps 214 is between about 2.25 kilowatts (kW) and 9.5 kW.

The chuck 200 may also include a bearing 218 located proximate to the disc 202 (for example, within about 3 inches of the disc 202) to provide increased rigidity to the chuck 200 during rotation. The bearing 218 may include, for example, a cross roller bearing, or the like.

The chuck 200 further includes a magnetic drive assembly 222 to rotate the disc 202. The magnetic drive assembly 222 includes an inner magnet 222A and an outer magnet 222B. The inner magnet 222A is attached, or fixed, to the shaft 204. In some embodiments, the inner magnet 222A is attached to a lower portion of the shaft 204 proximate an end of the shaft 204 opposite the disc 202. The outer magnet 222B is disposed outside of the housing 206 proximate to the inner magnet 222A. The outer magnet 222B may be driven by a suitable mechanism, for example by a belt drive or a motor, to drive the inner magnet 222A, and the shaft 204 and the disc 202. Because the inner magnet 222A is disposed within the housing 206, the inner magnet 222A is at vacuum pressure and because the outer magnet 222B is disposed outside of the housing 206, the outer magnet 222B is at atmospheric pressure. However, both the inner magnet 222A and the outer magnet 222B may instead be disposed within the housing 206. Thus, the magnetic drive assembly 222 rotates the disc 202 and the shaft 204 with respect to the process chamber and the remaining components of the chuck 200 which remain stationary (e.g., the housing 206, the lamp housing 216, and the like). Alternatively, the magnetic drive assembly 222 can use other configurations to rotate the disc 202 and the shaft 204. For example, in some embodiments, the inner magnet 222A and the outer magnet 222B can function respectively as a rotor and stator with a conductor wrapped around the stator to electromagnetically drive the rotor.

The chuck 200 also includes a bearing assembly 224 located at an end of the shaft 204 opposite the disc 202. The bearing assembly 224 supports the shaft 204 and facilitates rotation of the shaft 204. In addition, the inventors have provided an improved way to route power to the chucking electrodes 208 through the bearing assembly 224 to facilitate providing power to the chucking electrodes 208 while rotating the chuck 200. Power is drawn from a DC power source 226 through connections (see FIG. 4A) in the housing 206 and routed to the bearing assembly 224. Current flows through the bearing assembly 224 and is subsequently routed to the chucking electrodes 208 via a plurality of chucking power lines 228 disposed within an interior of the shaft 204.

Figure 3:
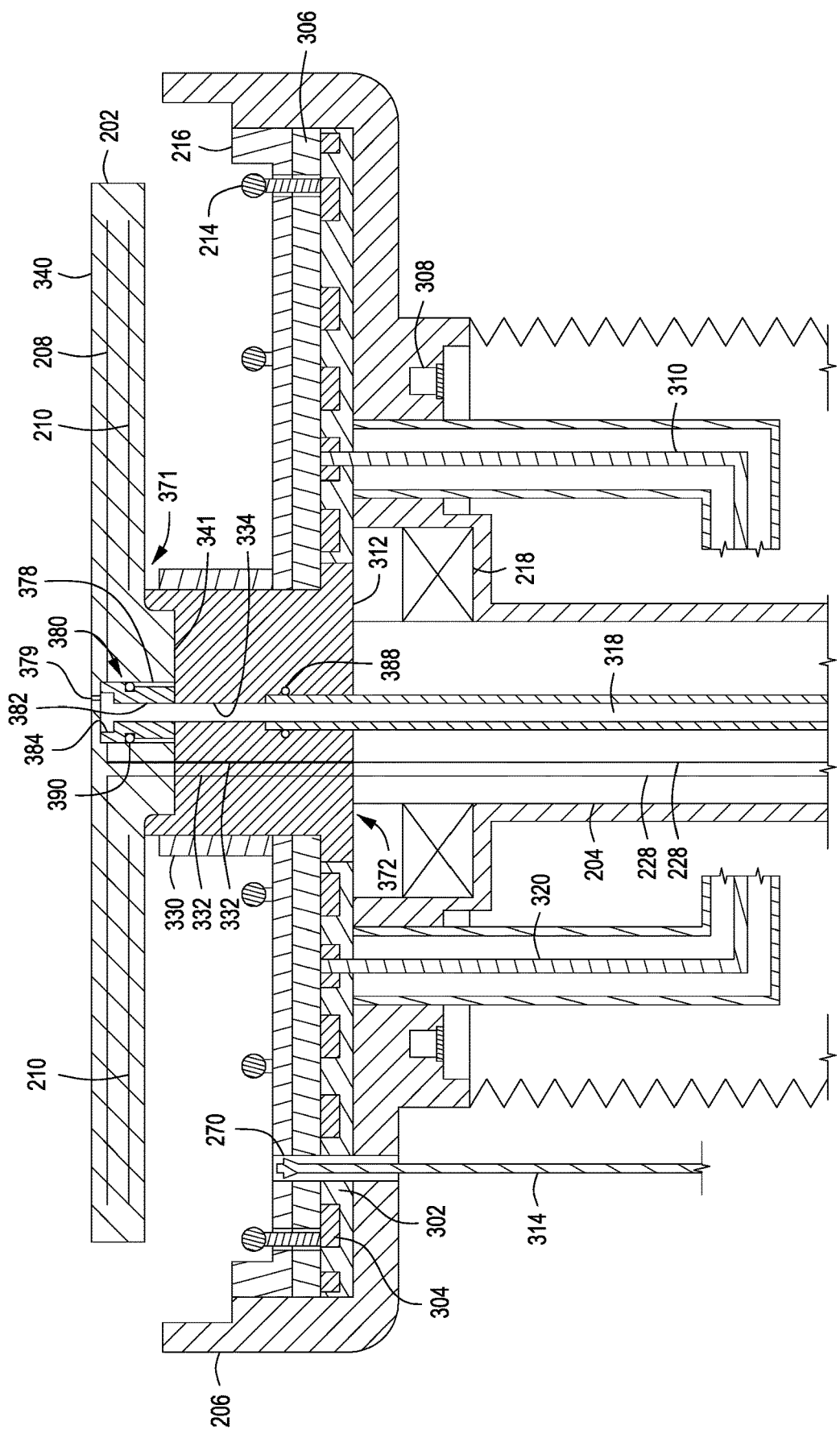
FIG. 3 depicts a cross-sectional view of an upper portion of an electrostatic chuck in accordance with some embodiments of the present disclosure.
Figure 6:
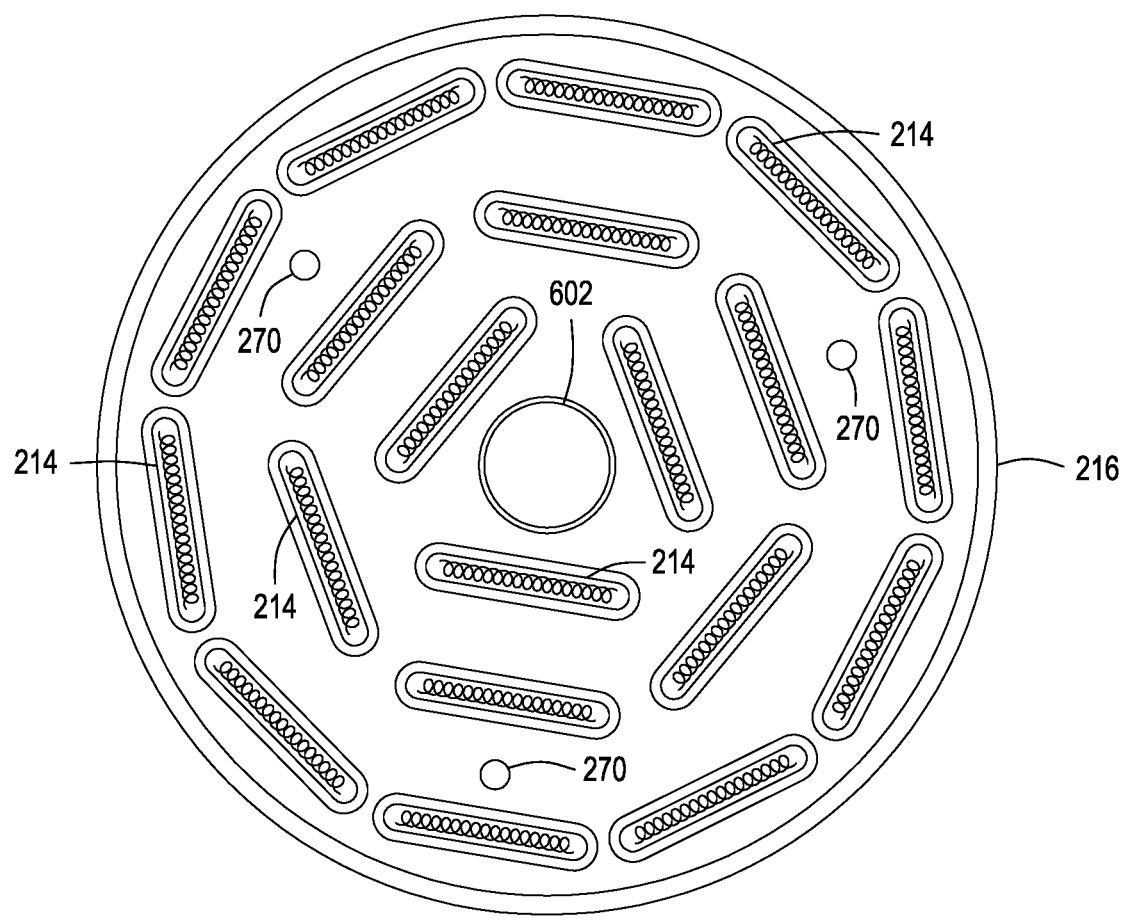
FIG. 6 depicts a top view of a substrate heating apparatus in accordance with some embodiments of the present disclosure.

Referring to the cross-sectional view of the chuck 200 in FIG. 3, the plurality of lamps 214 receive power from a plurality of conductors 304 disposed in a dielectric plate 302, such as a ceramic plate. The conductors 304 may receive power from the DC power source 226 or from another power supply (not shown) via heater power lines (e.g., conductors) 310, 320. In some embodiments, a dielectric layer 306 may be disposed atop the dielectric plate 302 to protect the conductors 304 and prevent inadvertent contact between the conductors 304 and any other conductive elements of the chuck 200. Openings in the dielectric layer 306 are provided to facilitate coupling the conductors 304 to respective lamps 214. In some embodiments, the plurality of lamps may be divided into a plurality of zones, for example, an inner array of lamps and an independently controllable outer array of lamps, as illustrated in FIG. 6.

As explained above, upon activation of the plurality of lamps 214, heat is generated and the disc 202 is heated. Because the heat is emitted in every direction, a plurality of fluid channels 308 are formed in the housing 206 to keep the housing 206 cool. Any suitable coolant (e.g., water, propylene glycol, or the like) may be flowed through the fluid channels 308 to cool the housing 206.

In order to facilitate placement and removal of a substrate on the disc 202, the chuck 200 may also include a lift pin assembly including a plurality of lift pins 314 to raise and lower a substrate off of or onto the disc 202. In some embodiments, at least one of the plurality of lift pins 314 may include a pyrometer to measure the temperature of the disc 202. A region of the disc 202 disposed opposite the lift pins 314 may be treated to have a very high emissivity to facilitate monitoring the temperature of the disc 202 by the pyrometer The chuck 200 further includes a dielectric pedestal support 312, to which the disc 202 is removably coupled. The pedestal support 312 includes a plurality of electrical taps 332 corresponding and coupled to the plurality of chucking power lines 228. The plurality of electrical taps 332 are coupled to the one or more chucking electrodes 298 and include at least a positive tap and a negative tap. In some embodiments, the plurality of electrical taps 332 may also include a center tap to balance the voltage between the positive and negative taps. In some embodiments, a metallic sleeve 330 may be disposed about the pedestal support 312 to shield the plurality of electrical taps 332 from radiation emitted by the plurality of lamps 214. In some embodiments, the metallic sleeve may be formed of aluminum. In some embodiments, the pedestal support 312 may be formed of aluminum oxide.

The pedestal support 312 further includes a central channel 334 disposed through the pedestal support 312 from a first end 371 to a second end 372 for providing backside gases through the disc 202 and to a backside of the substrate when disposed on the disc 202 during processing. The central channel 334 is fluidly coupled to a conduit 318 which is disposed within the shaft 204 and fluidly coupled to the gas supply 141. In some embodiments, and as illustrated in FIG. 3, the conduit 318 extends partially into the pedestal support 312 (i.e., into the central channel 334). In such embodiments, a dynamic seal o-ring 388 is disposed between the outer wall of the conduit 318 and the inner wall of the central channel 334. The dynamic seal o-ring 388 provides a dynamic seal to prevent leakage of any backside gases during rotation of the pedestal support 312 about the conduit 318, which is stationary.

The pedestal support 312 is coupled to the disc 202 at the first end 371 and to the shaft 204 at the second end 372. The pedestal support 312 supports the disc 202 in a spaced apart relation to the plurality of lamps 214. The coupling of the disc 202 to the shaft will be explained in more detail below with respect to FIG. 5.

The following description of the disc 202 will be made with reference to FIG. 3, which shows a cross section of the disc 202, and FIG. 5, which shows a top view of the disc 202. In some embodiments, the disc 202 may have a thickness between about 5 mm and about 7 mm. The disc 202 has an upper surface 340 and a lower surface 341. A plurality of substrate support elements 502 (shown in FIG. 5) protrude from the upper surface 340 to support a substrate. In some embodiments, each of the plurality of substrate support elements 502 has a height between about 2.5 microns and about 3.25 microns. In some embodiments, at least some of the plurality of substrate support elements 502 may be arcuate (or linear and elongate) and aligned along a plurality of concentric circular paths (best seen in FIG. 5).

A hole 378 is formed in the lower surface 341 at a center of and partially through the disc 202. A plurality of gas holes 379 are formed in the upper surface 340 proximate the center of the disc 202 above the hole 378 so that the plurality of gas holes 379 are fluidly coupled to the hole 378. The disc 202 further includes a plurality of gas distribution grooves formed in the upper surface 340 and fluidly coupled to the gas holes 379.

Figure 5:
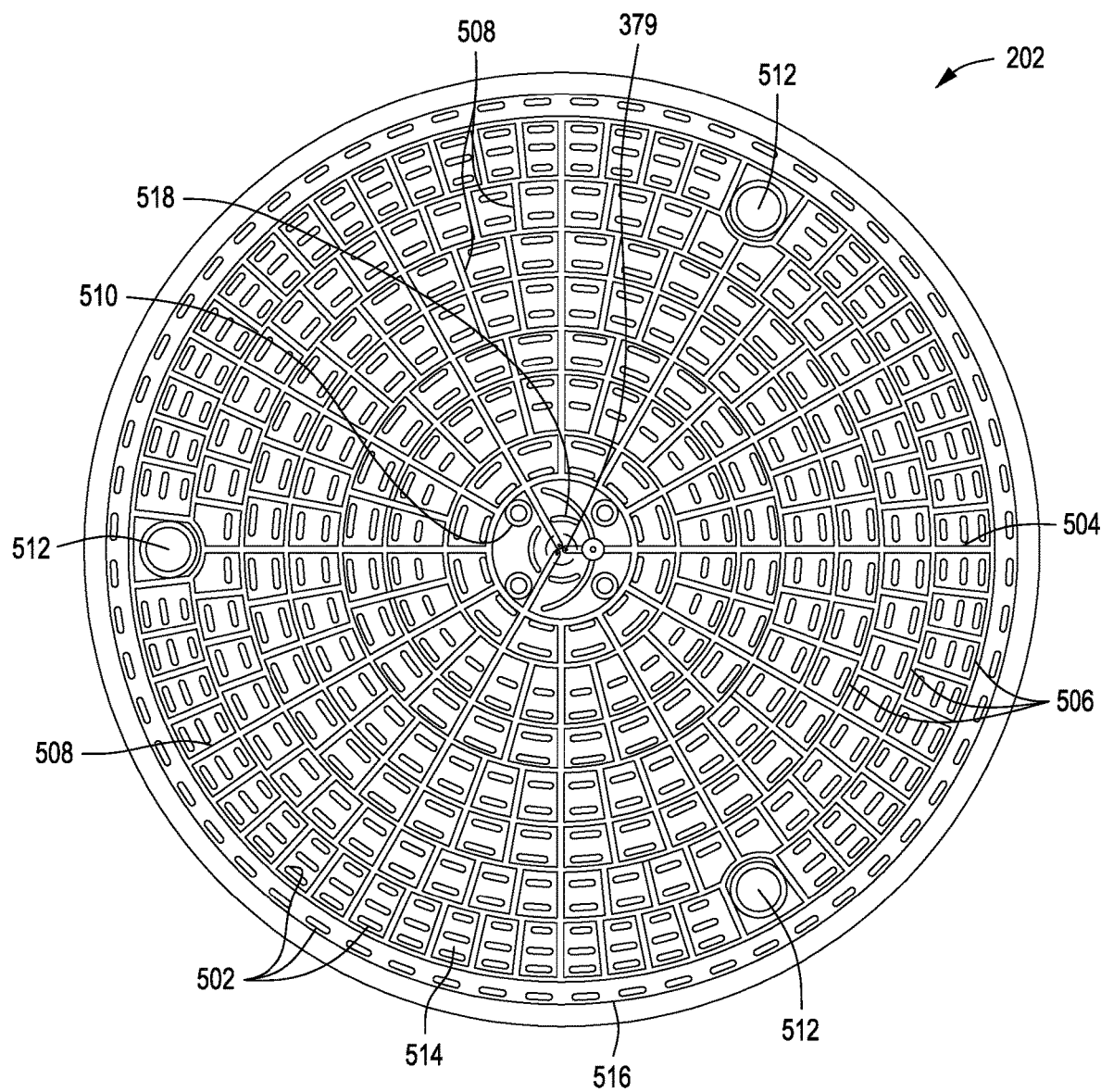
FIG. 5 depicts a top view of a substrate support pedestal in accordance with some embodiments of the present disclosure.

As illustrated in FIG. 5, the plurality of gas distribution grooves includes a plurality of radial grooves 504, a plurality of annular grooves 506, and a plurality of intermediate grooves 508. The plurality of radial grooves 504 correspond to and extend radially outward from the plurality of gas holes 379. In some embodiments, there are three gas holes 379 and three corresponding radial grooves 504, one each running from a respective gas hole 379 to an outermost annular groove of the plurality of annular grooves 506. The plurality of annular grooves 506 intersect with and are fluidly coupled to the plurality of radial grooves 504. The plurality of intermediate grooves 508 are disposed between and intersect with the plurality of annular grooves 506. The plurality of gas distribution grooves advantageously provides a flow path for gases flowing through the plurality of gas holes 379 so that the gases are uniformly distributed across the backside of the substrate being processed. In some embodiments, each of the plurality of gas distribution grooves has a depth of about 100 microns. An outer ring 516, adjacent to the outermost annular groove of the plurality of annular grooves 506 substantially contains the gases flowing in the plurality of gas distribution grooves. The pattern of the plurality of gas distribution grooves forms islands 514 and the outer ring 516 in the upper surface 340 of the disc 202. The substrate support elements 502 protrude from the islands 514 and the outer ring 516. Additional substrate support elements 518 may be formed proximate the center of the disc 202 to further support the center of the substrate when disposed on the disc 202.

As explained above, the inventors have discovered that because conventional substrate support pedestals are bonded to the chuck, switching between low and high temperature chucks reduces throughput of the system. As such, in some embodiments, the disc 202 may include a plurality of mounting holes 510 extending through the disc 202 to accommodate a corresponding plurality of fixation elements (such as bolts or the like) to advantageously facilitate coupling the disc 202 to the chuck (e.g., to an underlying support such as the pedestal support 312, as shown in FIG. 3) in a more easily removable and replaceable manner. The disc 202 further includes a plurality of lift pin holes 512 through which lift pins 314 extend to lift a substrate off of the disc 202 or receive a substrate to be processed.

Returning to FIG. 3, in some embodiments, the disc 202 further includes a gas plug 380 disposed in the hole 378 beneath the plurality of gas holes 379. In some embodiments, the gas plug 380 may be held in position with a canted spring 390 disposed between an outer wall of the gas plug 280 and an inner wall of the hole 378. The gas plug 380 includes a channel 382 having a first diameter and extending along a central axis of the gas plug 380. The channel 382 terminates at an expansion opening 384 formed in a top surface of the gas plug. The expansion opening 384 has a second diameter larger than the first diameter and is configured to allow backside gases flowing through the channel 382 to expand into the expansion opening 384 before flowing through the plurality of gas holes 379. Because the respective sizes of the plurality of gas holes 379 is relatively small compared with the size of the expansion opening 384, the expansion opening 384 acts a choke point, thus advantageously resulting in uniform gas flow through each of the plurality of gas holes 379. Together, the conduit 318, the central channel 334, the channel 382, the expansion opening 384, the gas holes 379, and the plurality of gas distribution grooves provide backside gases to the backside of the substrate being processed. In some embodiments, the gas plug 380 is formed of a dielectric material such as, for example, aluminum oxide.

Figure 4A:
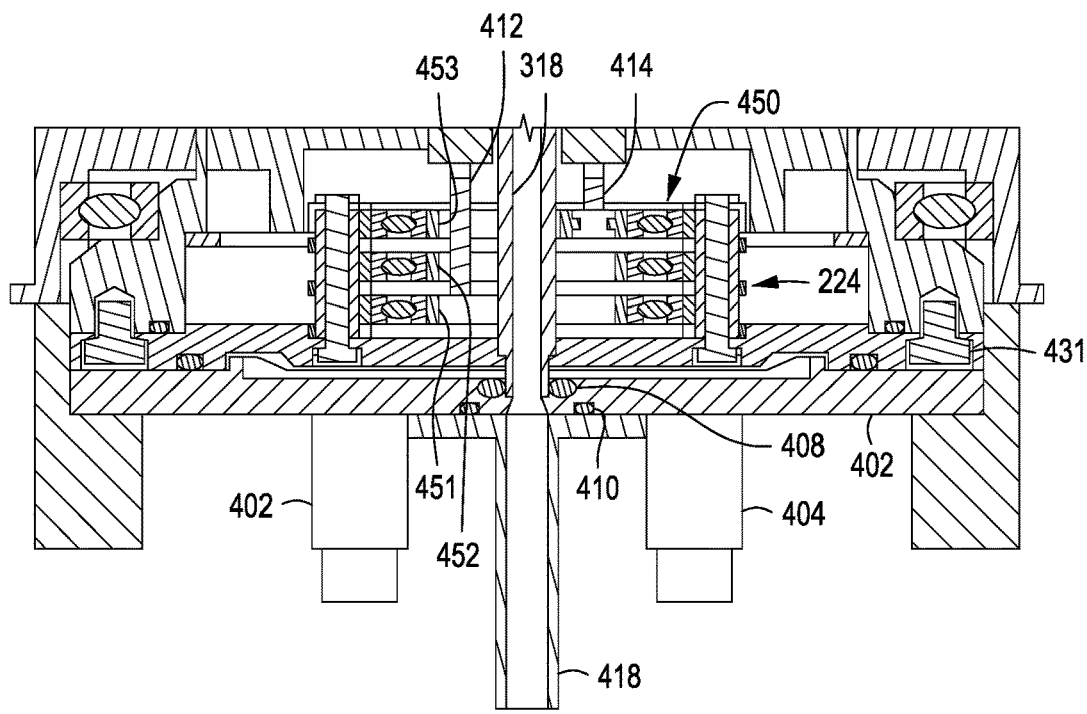
FIG. 4A depicts a cross-sectional view of a lower portion of an electrostatic chuck in accordance with some embodiments of the present disclosure.
Figure 4B:
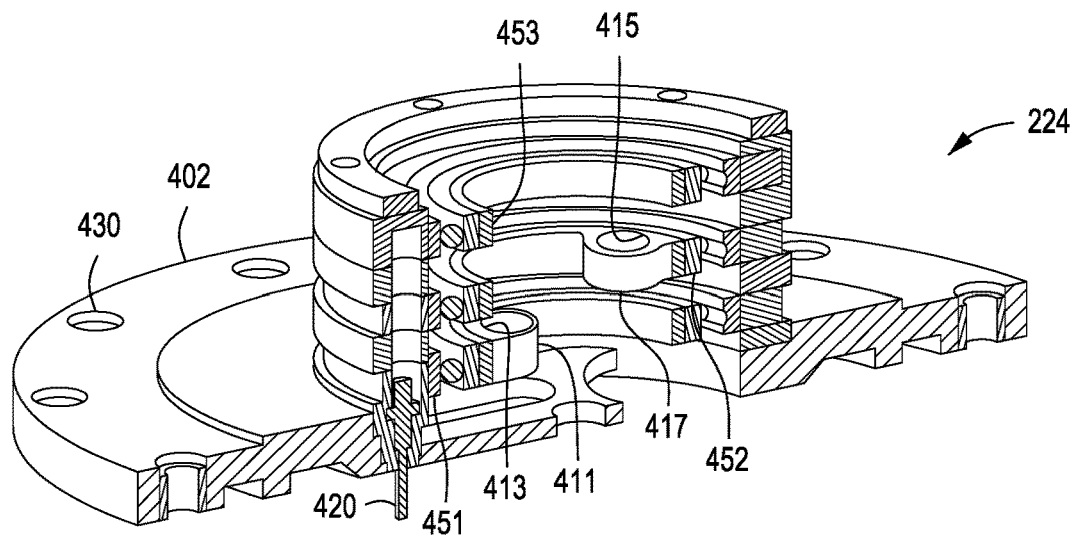
FIG. 4B depicts an isometric cross-sectional view of a bearing assembly for use with an electrostatic chuck in accordance with some embodiments of the present disclosure.

FIG. 4A depicts a cross-sectional view of a bearing assembly disposed in a bottom portion of the chuck in accordance with some embodiments of the present disclosure. FIG. 4B depicts an isometric cross-sectional view of a bearing assembly in accordance with some embodiments of the present disclosure. In some embodiments, the bearing assembly is the bearing assembly 224 discussed above. In some embodiments, the bearing assembly 224 includes a plurality of bearings 450 electrically coupled to positive and negative power connections 402, 404, which are electrically coupled to the respective positive and negative leads of a DC power supply (e.g., the chucking power supply 140). For example, a first bearing 451 of the plurality of bearings 450 may be electrically coupled to the positive power connection 402 via a first conductive element 420. Similarly, a second bearing 452 may be electrically coupled to the negative power connection 404 via a second conductive element (not shown) similar to the first conductive element 420. The conductive elements are configured such that each conductive element is only in electrical contact with one of the plurality of bearings 350. In the example in which the first bearing 451 is electrically coupled the positive power connection 402, a positive tap 412 (FIG. 4A) extends into a first hole 413 of a first nub 411 (FIG. 4B) to receive positive DC power. Similarly, a negative tap 414 (FIG. 4A) extends into a second hole 415 of a second nub 417 (FIG. 4B) to receive negative DC power. The positive and negative taps 412, 414 are electrically coupled to the plurality of chucking power lines 228 to provide DC power to the one or more chucking electrodes 208. In some embodiments, the center tap mentioned above (not shown), may be coupled to a third bearing 453.

In some embodiments, the bearing assembly 224 may have a base portion 422 which includes a plurality of fixation holes 430 for receiving a corresponding plurality of fixation elements 431 to couple the bearing assembly 224 to the chuck 200. As illustrated in FIG. 4A, the conduit 318 extends through the middle of the bearing assembly 224 and terminates at the base portion 422. A first sealing member 408 may be disposed about the conduit 318 at the interface of the conduit 318 and the base portion 422 to prevent leakage any gases. A gas connection 418 is coupled to the base portion 422 opposite the conduit 318 at one end and to the gas supply 141 at an opposite end. A second sealing member 410 may be disposed between a portion of the gas connection 418 and the base portion 422 to prevent leakage of any gases.

FIG. 6 depicts a top view of the lamp housing 216 having the plurality of lamps 214. As explained above, the plurality of lamps 214 heat the disc 202 and the substrate disposed atop the disc 202. The lamp housing 216 also include a central hole 602 through which the pedestal support 312 extends and the plurality of holes 270 to allow the plurality of lift pins 314 to pass through the lamp housing 216. Although shown in a particular configuration, the shape and number of the lamps may be varied to provide a desired heat profile on the disc 202.

While the foregoing is directed to embodiments of the present disclosure, other and further embodiments of the disclosure may be devised without departing from the basic scope thereof.

The invention claimed is:
1. A substrate support pedestal, comprising:
a body having an upper surface and a lower surface opposite the upper surface;
one or more chucking electrodes disposed within the body;
a plurality of substrate support elements protruding from the upper surface to support a substrate;
a hole disposed in the lower surface at a center of and partially through the body;
a plurality of gas holes disposed in the upper surface proximate the center of the body, wherein the plurality of gas holes is disposed above and fluidly coupled to the hole; and
a plurality of gas distribution grooves formed in the upper surface and fluidly coupled to the plurality of gas holes.

2. The substrate support pedestal of claim 1, wherein the body is a dielectric disc.
3. The substrate support pedestal of claim 2, wherein the dielectric disc has a thickness between about 5 mm and about 7 mm.
4. The substrate support pedestal of claim 2, wherein the plurality of gas distribution grooves comprises:
a plurality of radial grooves corresponding to and extending radially outward from the plurality of gas holes;
a plurality of annular grooves fluidly coupled to the plurality of radial grooves; and
a plurality of intermediate grooves disposed between the plurality of annular grooves.
5. The substrate support pedestal of claim 1, wherein each of the plurality of substrate support elements has a height between about 2.5 microns and about 3.25 microns.
6. The substrate support pedestal of claim 1, wherein the plurality of gas distribution grooves have a depth of about 100 microns.
7. The substrate support pedestal of claim 1, further comprising:
a plurality of mounting holes configured to receive a corresponding plurality of fixation elements to couple the substrate support pedestal to an underlying support.
8. The substrate support pedestal of claim 1, further comprising:
a gas plug disposed in the hole beneath the plurality of gas holes,
wherein the gas plug includes a channel extending along a central axis of the gas plug and having a first diameter,
wherein the channel terminates at an expansion opening formed in a top surface of the gas plug, and
wherein the expansion opening has a second diameter larger than the first diameter to allow gas passing through the channel to expand into the expansion opening before flowing through the plurality of gas holes.
9. An electrostatic chuck, comprising:
the substrate support pedestal of claim 1;
a lamp housing disposed below the substrate support pedestal and having a plurality of lamps configured to heat the substrate support pedestal and the substrate, wherein the lamp housing includes a central hole;
a pedestal support extending through the central hole and coupled to the lower surface of the substrate support pedestal at a first end of the pedestal support to support the substrate support pedestal in a spaced apart relation to the plurality of lamps, wherein a plurality of electrical taps pass through the pedestal support and are coupled to the one or more chucking electrodes in the substrate support pedestal;
a shaft coupled to a second end of the pedestal support opposite the first end; and
a rotation assembly coupled to the shaft opposite the pedestal support to rotate the shaft, the pedestal support, and the substrate support pedestal with respect to the lamp housing.
10. The electrostatic chuck of claim 9, further comprising:
a metallic sleeve disposed about the pedestal support to shield the plurality of electrical taps from radiation generated by the plurality of lamps.
11. The electrostatic chuck of claim 9, wherein the plurality of lamps includes halogen lamps and has a total power output between about 2.25 kW and about 9.5 kW.

12. The electrostatic chuck of claim 9, wherein the plurality of lamps include an inner array of lamps and an independently controllable outer array of lamps.

13. The electrostatic chuck of claim 9, further comprising: a bearing assembly disposed about the shaft.

14. The electrostatic chuck of claim 13, wherein the bearing assembly is electrically coupled to the chucking electrode such that power can be fed through the bearing assembly to provide power to the one or more chucking electrodes.

15. The electrostatic chuck of claim 14, further comprising:
a DC power source having a positive lead and a negative lead,
wherein the bearing assembly includes at least a first bearing and a second bearing,
wherein the plurality of electrical taps includes at least a positive tap and a negative tap,
wherein the positive lead is coupled to the first bearing and the negative lead is coupled to the second bearing, and
wherein the positive tap is coupled to the first bearing and the negative tap is coupled to the second bearing.

16. A processing chamber, comprising:
a chamber body defining an interior volume; and
a substrate support disposed within the interior volume, the substrate support having a substrate support pedestal comprising:
a body having an upper surface and a lower surface opposite the upper surface;
one or more chucking electrodes disposed within the body;
a plurality of substrate support elements protruding from the upper surface to support a substrate;
a hole disposed in the lower surface at a center of and partially through the body;
a plurality of gas holes disposed in the upper surface proximate the center of the body, wherein the plurality of gas holes is disposed above and fluidly coupled to the hole; and
a plurality of gas distribution grooves formed in the upper surface and fluidly coupled to the plurality of gas holes.

17. The processing chamber of claim 16, further comprising:
a gas supply,
wherein the substrate support pedestal further comprises:
a gas plug disposed in the hole beneath the plurality of gas holes,
wherein the gas plug includes a channel fluidly coupled to the gas supply and extending along a central axis of the gas plug and having a first diameter,
wherein the channel terminates at an expansion opening formed in a top surface of the gas plug, and
wherein the expansion opening has a second diameter larger than the first diameter to allow gas passing through the channel to expand into the expansion opening before flowing through the plurality of gas holes.

18. A substrate support pedestal, comprising:
a body having an upper surface and a lower surface opposite the upper surface;
one or more chucking electrodes disposed within the body;
a plurality of substrate support elements protruding from the upper surface to support a substrate;
a hole disposed in the lower surface at a center of and partially through the body;
a plurality of gas holes disposed in the upper surface proximate the center of the body, wherein the plurality of gas holes is disposed above and fluidly coupled to the hole;
a plurality of gas distribution grooves formed in the upper surface and fluidly coupled to the plurality of gas holes; and
a gas plug disposed in the hole beneath the plurality of gas holes,
wherein the gas plug includes a channel extending along a central axis of the gas plug and having a first diameter,
wherein the channel terminates at an expansion opening formed in a top surface of the gas plug, and
wherein the expansion opening has a second diameter larger than the first diameter to allow gas passing through the channel to expand into the expansion opening before flowing through the plurality of gas holes.

19. The substrate support pedestal of claim 18, wherein the plurality of gas distribution grooves comprises:
a plurality of radial grooves corresponding to and extending radially outward from the plurality of gas holes;
a plurality of annular grooves fluidly coupled to the plurality of radial grooves; and
a plurality of intermediate grooves disposed between the plurality of annular grooves.

20. An electrostatic chuck, comprising:
the substrate support pedestal of claim 18;
a lamp housing disposed below the substrate support pedestal and having a plurality of lamps configured to heat the substrate support pedestal and the substrate, wherein the lamp housing includes a central hole;
a pedestal support extending through the central hole and coupled to the lower surface of the substrate support pedestal at a first end of the pedestal support to support the substrate support pedestal in a spaced apart relation to the plurality of lamps, wherein a plurality of electrical taps pass through the pedestal support and are coupled to the one or more chucking electrodes in the substrate support pedestal;
a shaft coupled to a second end of the pedestal support opposite the first end; and
a rotation assembly coupled to the shaft opposite the pedestal support to rotate the shaft, the pedestal support, and the substrate support pedestal with respect to the lamp housing.

* * * * *